(12) United States Patent
Murakami et al.

(10) Patent No.: US 7,169,473 B2
(45) Date of Patent: Jan. 30, 2007

(54) CARBON FILM-COATED ARTICLE AND METHOD OF PRODUCING THE SAME

(75) Inventors: Yasuo Murakami, Kyoto (JP); Takashi Mikami, Kyoto (JP); Hiroshi Murakami, Kyoto (JP)

(73) Assignee: Nissin Electric Co., Ltd. (JP)

( * ) Notice: Subject to any disclaimer, the term of this patent is extended or adjusted under 35 U.S.C. 154(b) by 341 days.

(21) Appl. No.: 10/465,618

(22) Filed: Jun. 20, 2003

(65) Prior Publication Data

US 2005/0186424 A1    Aug. 25, 2005

(30) Foreign Application Priority Data

Jul. 10, 2002 (JP) ............... 2002-201339

(51) Int. Cl.
*C23C 14/06* (2006.01)

(52) U.S. Cl. ............. 428/408; 428/469; 428/698; 428/336; 428/216

(58) Field of Classification Search ............. 428/408, 428/469, 698, 336, 216
See application file for complete search history.

(56) References Cited

U.S. PATENT DOCUMENTS

| | | | |
|---|---|---|---|
| 4,842,937 A * | 6/1989 | Meyer et al. | 428/408 |
| 5,215,823 A * | 6/1993 | Itoh et al. | 428/469 |
| 6,126,793 A | 10/2000 | Sugiyama et al. | |
| 6,337,000 B1 | 1/2002 | Miya et al. | |
| 2001/0024737 A1 | 9/2001 | Utsumi et al. | |

FOREIGN PATENT DOCUMENTS

| | | |
|---|---|---|
| EP | 0 718 417 A1 | 6/1996 |
| EP | 0 952 238 A1 | 10/1999 |
| EP | 1 123 990 A1 | 8/2001 |
| JP | 2000-087218 | 3/2000 |

OTHER PUBLICATIONS

EPO Search Report dated Oct. 29, 2003.
Kwang-Ryeol Lee et al. "Design of W buffer layer of adhesion improvement of DLC films on tool steels", Thin Solid Films 377-378 (2000) 261-268, Elsevier.

* cited by examiner

*Primary Examiner*—Archene Turner
(74) *Attorney, Agent, or Firm*—Rader, Fishman & Grauer PLLC

(57) ABSTRACT

This invention is directed to a carbon film-coated article comprising a substrate; a mixed layer formed on at least a part of the substrate, and composed of an element(s) constituting the substrate and tungsten; a tungsten film formed on the mixed layer; and a carbon film formed on the tungsten film. The invention provides a method of producing the carbon film-coated article, the method comprising the steps of: forming a mixed layer on at least a part of the substrate, the mixed layer being composed of an element(s) constituting the substrate and tungsten, forming a tungsten film on the mixed layer, and forming a carbon film on the tungsten film, wherein at least one of the mixing layer, the tungsten film and the carbon film is formed using a cathode material evaporated by arc discharge in a vacuum arc deposition apparatus having a vacuum arc evaporation source including the cathode.

7 Claims, 3 Drawing Sheets

CARBON FILM-COATED ARTICLE AND METHOD OF PRODUCING THE SAME

CROSS-REFERENCE TO RELATED APPLICATION

This application is based on Japanese patent application No. 2002-201339 filed in Japan on Jul. 10, 2002, the entire content of which is hereby incorporated by reference.

BACKGROUND OF THE INVENTION

1. Field of the Invention

The present invention relates to carbon film-coated articles which can be used as parts of engines (e.g., internal combustion engines including gasoline engines, diesel engines or the like), cutting articles such as cutting tools, parts of cutting tools, etc., and a method of producing the same.

2. Description of Related Art

A carbon film such as a DLC film (diamond-like carbon film) has a high hardness, a high wear resistance and a low friction coefficient. It has been proposed to increase the wear resistance of and lower the coefficient of friction of engine parts, cutting articles and like sliding articles by utilizing such characteristics of the carbon film. The wear resistance and the coefficient of friction of the sliding articles can be improved by coating the sliding articles with the DLC film or like carbon films.

However, generally the DLC film and like carbon films are low in the adhesion to the substrate of the sliding articles made of steel or the like and therefore are easily separable from the substrate. For improving the adhesion of the DLC film and like carbon films to the substrate, it was proposed to form an intermediate layer between the carbon film and the substrate. The proposal, however, failed to create a sufficient adhesion.

SUMMARY OF THE INVENTION

An object of the present invention is to provide a carbon film-coated article, i.e., an article having a carbon film formed on a substrate of the article, the carbon film having a high adhesion to the substrate of the article, and a method of producing the same.

To achieve the above-mentioned object, the invention provides the following carbon film-coated article and the following producing method.

(1) Carbon Film-coated Article

A carbon film-coated article comprising a substrate; a mixed layer formed on at least a part of the substrate, the mixed layer being composed of an element(s) constituting the substrate and tungsten; a tungsten film formed on the mixed layer; and a carbon film formed on the tungsten film.

(2) Method of Producing a Carbon Film-coated Article

A method of producing a carbon film-coated article comprising a substrate; a mixed layer formed on at least a part of the substrate, the mixed layer being composed of an element(s) constituting the substrate and tungsten; a tungsten film formed on the mixed layer; and a carbon film formed on the tungsten film, the method comprising the steps of:

forming the mixed layer on at least a part of the substrate, the mixed layer being composed of an element(s) constituting the substrate and tungsten, forming the tungsten film on the mixed layer, and forming the carbon film on the tungsten film;

wherein at least one of the mixed layer, the tungsten film and the carbon film is formed using a cathode material evaporated by arc discharge in a vacuum arc deposition apparatus having a vacuum arc evaporation source including the cathode.

The foregoing and other objects, features, aspects and advantages of the present invention will become more apparent from the following detailed description and the accompanying drawings.

Figure 1:
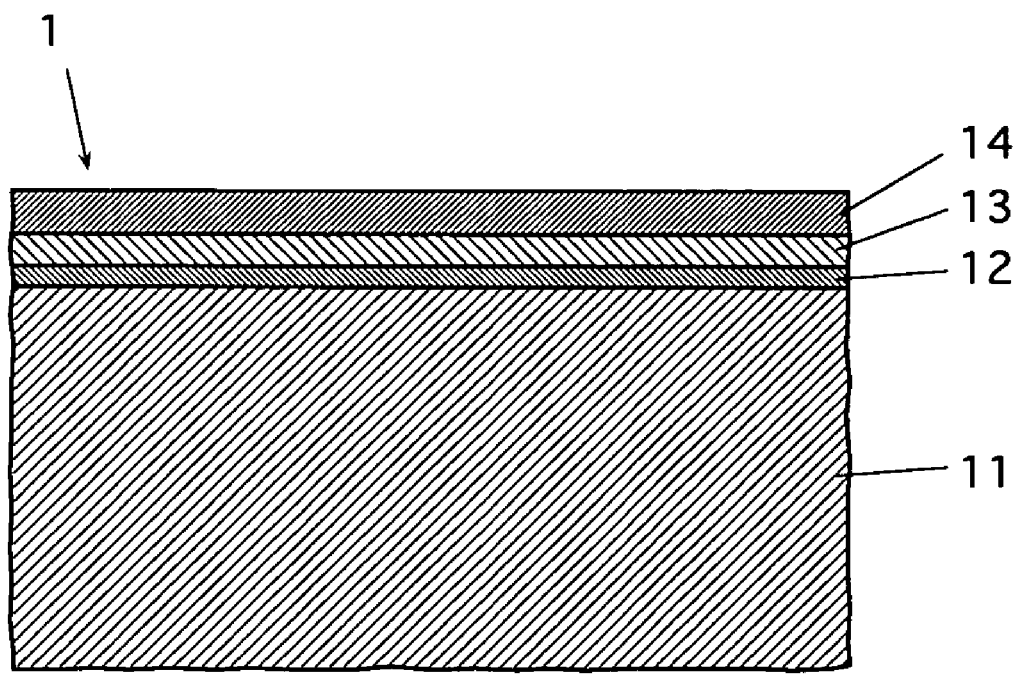
FIG. 1 is a partially sectional view showing an example of the carbon film-coated article.

DESCRIPTION OF THE PREFERRED EMBODIMENTS (1) Carbon Film-coated Article

A carbon film-coated article as a preferred embodiment of the invention has a mixed layer, a tungsten film, and a carbon film formed on the substrate in this order. More specifically, a mixed layer, a tungsten film and a carbon film are formed over at least a part of the substrate of the article.

The substrate which requires high mechanical strength may be made of a material including iron as the main component such as carbon steel, special steel or like steels. Optionally the substrate may be made of ceramic(s), cemented carbide (hard metal) or the like.

The mixed layer is formed on the substrate and contains an element(s) constituting the substrate (material(s) constituting the substrate) and tungsten (W) and may contain other element(s).

The tungsten film is formed between the mixed layer and the carbon film. The tungsten film contains tungsten (W) as the main component and may contain impurities (minor components).

The carbon film is formed on the tungsten film. The carbon film contains carbon (C) as the main component and may contain impurities including carbon nitride, silicon or the like. The carbon film may be, for example, a DLC film (diamond-like carbon film).

As shown in the results of experiments to be described later, the adhesion of the carbon film to the tungsten film is higher than the adhesion of the carbon film to a molybdenum film or a chromium film.

Since the mixed layer containing the element(s) constituting the substrate and the tungsten is formed between the substrate and the tungsten film, the adhesion of the tungsten film to the substrate is high. Thereby, the adhesion of the carbon film to the substrate is high in the carbon film-coated article.

The carbon film (especially DLC film) has a high hardness and a low coefficient of friction so that the carbon film-coated articles can be preferably used as members which are required to have at least one of wear resistance and low friction charactristic. For example, the carbon film-coated articles (carbon film-coated members) can be used as sliding members (sliding parts).

More specifically, the carbon film-coated articles can be used as engine parts such as cams, shims, valve lifters, plungers, piston rings and the like and other machine parts, cutting articles such as drills, end mills, milling cutters, cutting tools and the like, molds, etc. The carbon film in such carbon film-coated article has such high adhesion to the substrate as described above that the article can stably retain the low friction characteristic and other characteristics for a long term.

In view of the service life of the carbon film-coated article, the carbon film may have a thickness of, e.g., 500 nm or more. When the carbon film is too thick, peel or cracks are likely to occur. Thus, the thickness of the carbon film may be, e.g., 10 μm or less. The stress may be relaxed by addition of metals or the like.

Too thick or too thin the tungsten film allows the reduction in its adhesion to the carbon film as shown in the results of experiments to be described later. The upper limit of thickness of the tungsten film is preferably 170 nm or less, more preferably 150 nm or less, most preferably 100 nm or less. The lower limit of thickness of the tungsten film is preferably 5 nm or more, more preferably 10 nm or more.

Too thick or too thin the mixed layer results in lower adhesion of the carbon film to the substrate as shown in the results of experiments to be described later. The upper limit of thickness of the mixed layer is preferably 200 nm or less, more preferably 100 nm or less, especially more preferably 50 nm or less, most preferably 10 nm or less. The lower limit of thickness of the mixed layer is preferably 1 nm or more, more preferably 2 nm or more.

(2) Method of Producing a Carbon Film-coated Article

A method of producing a carbon film-coated article as a preferred embodiment of the present invention comprises the steps of:
  forming on a substrate of an article a mixed layer containing an element(s) constituting the substrate and tungsten,
  forming a tungsten film on the mixed layer, and
  forming a carbon film on the tungsten film.

At least one of the mixing layer, the tungsten film and the carbon film is formed by a vacuum arc deposition apparatus (arc-type ion plating apparatus). The vacuum arc deposition apparatus has at least one vacuum arc evaporation source including a cathode. In the vacuum arc deposition apparatus, a layer or a film can be formed using a cathode material (substance constituting the cathode selected according to the layer or film to be formed) evaporated by arc discharge, more specifically by ionizing an evaporated cathode material by plasma generated in the vicinity of the cathode. Any of the mixed layer, the tungsten film and the carbon film may be formed by the vacuum arc deposition apparatus.

When the vacuum arc deposition apparatus is employed, the ionized cathode material may be attracted to the substrate by a bias voltage to be applied to the substrate and may be made to collide with the substrate. Such bias application may be carried out in forming any of the mixed layer, the tungsten film and the carbon film.

The mixed layer can be formed by subjecting the substrate to a bombarding process (vacuum arc deposition operation involving a bombarding process) using tungsten as a cathode material (in other words, using a cathode mainly containing tungsten) in the vacuum arc deposition apparatus. More specifically, tungsten as the cathode material is ionized by a plasma while applying a relatively high bias voltage to the substrate, so that the ionized tungsten is driven into the substrate (namely the substrate is subjected to a bombarding process), thereby forming the mixed layer containing an element(s) constituting the substrate and tungsten.

In this case, presumably the surface of the substrate may be improved in characteristic(s) by the bombarding process, resulting in formation of the mixed layer. When the mixed layer is formed by the bombarding process, the surface of the substrate is subjected to sputter cleaning and the substrate is heated, whereby the tungsten film to be formed later is increased in its adhesion to the mixed layer.

The tungsten film can be formed by a vacuum arc deposition method using tungsten as a cathode material (in other words, using a cathode mainly containing tungsten) in the vacuum arc deposition apparatus. For example, when tungsten as the cathode material is made into plasma and is ionized while applying a relatively low bias voltage to the substrate, the ionized tungsten is deposited on the substrate (the mixed layer on the substrate) to form the tungsten film. It is optional, e.g., to apply a bias voltage to the substrate which is lower in an absolute value (including 0V) than when the mixed layer is formed by the bombarding process.

The carbon film can be formed by a vacuum arc deposition method using carbon as a cathode material (in other words, using a cathode mainly containing carbon) in the vacuum arc deposition apparatus. For example, when carbon as the cathode material is made into plasma and is ionized while applying a bias voltage to the substrate, the ionized carbon is deposited on the substrate (the tungsten film on the substrate) to form the carbon film.

Any of the mixed layer, the tungsten film and the carbon film can be formed by other methods than those using the foregoing vacuum arc deposition apparatus. The carbon film may be formed, for example, by a plasma CVD method, sputtering method, laser deposition method or the like. However, any of the mixed layer, the tungsten film and the carbon film can be formed at a relatively high deposition rate by the method using the vacuum arc deposition apparatus. This is because the ion density of the cathode material in the plasma can be relatively increased due to evaporation of the cathode material by arc discharge. When the vacuum arc deposition apparatus is used, the mixed layer, the tungsten film and the carbon film can be formed even on the substrate of the article in a relatively complicated shape (e.g. substrate in a cubic shape), and deposition is easily feasible even over a large area.

Further, the carbon film formed by the vacuum arc deposition method is more highly hard and lower in hydrogen content than when formed by a plasma CVD method, sputtering method or laser deposition method. When the carbon film is formed by the vacuum arc deposition method, it may be done while applying a pulse-type bias voltage to the substrate. Thereby the internal stress in the carbon film thus formed can be lowered and the carbon film with a highly smooth surface can be formed.

In the foregoing method of producing a carbon film-coated article, at least one of the mixed layer, the tungsten film and the carbon film is formed in the vacuum arc deposition apparatus. For example, all of the mixed layer, the tungsten film and the carbon film may be formed in the same vacuum arc deposition apparatus. When the mixed layer, the tungsten film and the carbon film are formed in the same vacuum arc deposition apparatus, transport of the substrate, removal of gas(es) from a process chamber, heating of the substrate can be performed in a shorter time than when one or two of them are formed in other apparatus.

This means that the mixed layer, the tungsten film and the carbon film can be so efficiently formed and a carbon film-coated article can be so efficiently produced. In this case, an interface between the mixed layer and the tungsten film and an interface between the tungsten film and the carbon film are unlikely to come into contact with impurities, and proper interfaces can be created.

A vacuum arc deposition apparatus to be commonly used in forming the mixed layer, the tungsten film and the carbon film has at least two vacuum arc evaporation sources, e.g., a first vacuum arc evaporation source including a tungsten cathode (cathode comprising tungsten as the main component) and a second vacuum arc evaporation source including a carbon cathode (cathode comprising carbon as the main component).

When the mixed layer, the tungsten film and the carbon film are formed by a vacuum arc deposition apparatus having only one vacuum arc evaporation source including a cathode, a tungsten cathode needs to be exchanged for a carbon cathode after forming the mixed layer and the tungsten film. When employing the vacuum arc deposition apparatus having the first and second vacuum arc evaporation sources, the time period for exchange of cathodes can be saved, and thereby a carbon film-coated article can be produced with more efficiency.

A vacuum arc deposition apparatus having two or more vacuum arc evaporation sources each including tungsten cathode may be used in order to increase the deposition rate in forming the mixed layer and/or the tungsten film. Likewise a vacuum arc deposition apparatus having two or more vacuum arc evaporation sources each including carbon cathode may be used in order to increase the deposition rate in forming the carbon film.

A vacuum arc deposition apparatus to be used in forming at least one of the mixed layer, the tungsten film and the carbon film may be of a magnetic filter type which has a magnetic filter for at least one vacuum arc evaporation source to prevent macro-particles of cathode material with a diameter of several micro-meters to tens of micro-meters from adhering to the substrate.

Especially when the carbon film is formed, it is preferred to use such vacuum arc deposition apparatus of the magnetic filter type. The reason is as follows. When the cathode is disposed as opposed to the substrate in forming the carbon film using a vacuum arc deposition apparatus having a vacuum arc evaporation source including a carbon cathode, the carbon macro-particles easily adhere to the surface of the substrate (tungsten film on the substrate).

(3) Description of an Example of Carbon Film-coated Article and Method of Producing the Same An example of the carbon film-coated article and a method of producing the same will be described with reference to the drawings. FIG. 1 is a partially sectional view schematically showing an example of the carbon film-coated article.

A carbon film-coated article 1 shown in FIG. 1 has a substrate 11 of the article. Superposed on at least a part of the substrate 11 are a mixed layer 12, a tungsten film 13 and a carbon film 14 as formed in this order from the substrate side.

The substrate 11 is made of chromium-molybdenum steel in this example. The mixed layer 12 contains an element(s) constituting the substrate and tungsten (W) In this example, the mixed layer contains iron (Fe), chromium (Cr), molybdenum (Mo) and tungsten. The mixed layer 12 has a thickness of 5 nm in this example. The tungsten film 13 is mainly composed of tungsten and has a thickness of 50 nm in this example. The carbon film 14 is a DLC film having a thickness of 500 nm in this example.

The carbon film-coated article 1 is excellent in low friction characteristic and wear resistance because it is covered with the highly hard DLC film (carbon film) 14. The adhesion between the DLC film 14 and the tungsten film 13, the adhesion between the tungsten film 13 and the mixed layer 12, and the adhesion between the mixed layer 12 and the substrate 11 are all good, so that the adhesion of the DLC film 14 to the substrate 11 is good. With this feature, the carbon film-coated article 1 can stably maintain the low friction characteristic and wear resistance for a long term.

The DLC film 14 in this example is formed by a vacuum arc deposition method using a vacuum arc deposition apparatus so that it has a less content of hydrogen than when formed by a plasma CVD method, sputtering method, laser deposition method or other methods. Thereby the DLC film 14 can stably exhibit the low friction characteristic and other characteristics even under high temperature environments.

In the carbon film-coated article 1 which has a low friction characteristic and a high wear resistance, the substrate 11 may be one of substrates for engine parts such as cams, shims, valve lifters, plungers, piston rings and the like and other machine, cutting articles such as drills, end mills, milling cutters, cutting tools or parts thereof, etc. The articles 1 having such substrates 11 can be preferably used as engine parts and like machine parts, cutting articles, etc. which require a low friction characteristic and a wear resistance.

The method of producing the carbon film-coated article 1 will be described. In this example, all of the mixed layer 12, tungsten film 13 and DLC film 14 are formed using a vacuum arc deposition apparatus having vacuum arc evaporation sources. More specifically, all of them are formed using the same vacuum arc deposition apparatus.

Figure 2:
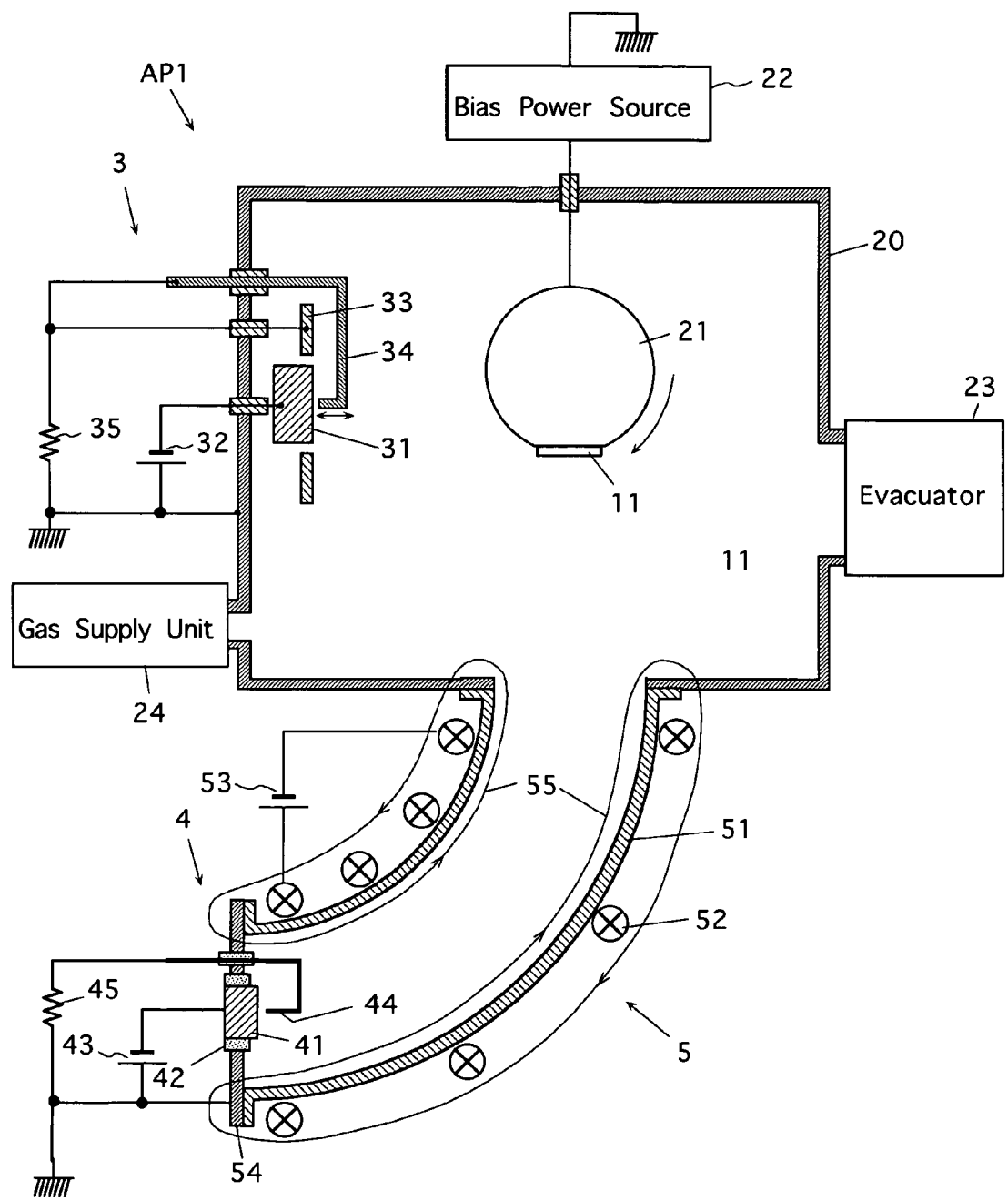
FIG. 2 is a schematic diagram showing the structure of an example of the vacuum arc deposition apparatus.

FIG. 2 is a schematic diagram showing the structure of an example of the vacuum arc deposition apparatus to be used in forming the mixed layer 12, tungsten film 13 and DLC film 14.

A vacuum arc deposition apparatus AP1 of FIG. 2 is of magnetic filter type and is provided with a vacuum chamber 20, a magnetic filter 5 and two vacuum arc evaporation sources 3, 4.

In the chamber 20, a holder 21 is disposed for holding the substrate 11 for forming the DLC film 14 or the like. A negative voltage can be applied to the substrate 11 from a bias power source 22 via the holder 21 supporting the substrate 11. The chamber 20 is grounded.

An evacuator 23 is connected to the chamber 20. The gas(es) is removed from the chamber 20 by the evacuator 23, whereby the gas pressure in the chamber 20 can be adjusted to a specified range. A gas supply unit 24 is connected to the chamber 20. A specified gas(es) can be introduced into the chamber 20 by the gas supply unit 24.

The vacuum arc evaporation source 3 has a cathode 31, an arc power source 32, a shield plate 33 and a trigger electrode 34. The cathode 31 is placed in the chamber 20, is opposed to the holder 21 and is composed of tungsten. The shield plate 33 is annular and is disposed so as to surround the cathode 31. A space is formed between the shield plate 33 and the cathode 31 which are electrically insulated from each other. The shield plate 33 is electrically connected to the chamber 20 via a resistor 35.

The trigger electrode 34 can be moved in right and left directions in the figure by a driving device (not shown) from a position wherein its tip is in contact with the cathode 31 to a position wherein its tip is out of contact therewith.

When the trigger electrode 34 is brought into and out of contact with the cathode 31 while applying a negative voltage from the arc power source 32 to the cathode 31, electric sparks are emitted between the trigger electrode 34 and the cathode 31. Arc discharge is triggered by the sparks.

Tungsten as a cathode material is heated by the arc discharge, melted and evaporated. Plasma is generated by the arc discharge in front of the cathode 31 (rightward of the cathode 31 in the figure), whereby the evaporated tungsten is partly ionized. In other words, in the vacuum arc evaporation source 3, plasma containing tungsten ions can be produced in front of the cathode 31 by arc discharge.

A magnetic filter 5 is provided to prevent macro-particles of cathode material for the vacuum arc evaporation source 4 from adhering to the substrate 11 supported by the holder 21. The magnetic filter 5 has a curved transport pipe 51, a magnetic coil 52 wound on the transport pipe 51 and a power source 53 for energizing the magnetic coil 52. The transport pipe 51 is connected to the chamber 20. In this example, the transport pipe 51 is curved at an angle of 90 degrees. One of openings in the transport pipe 51 is opposed to the holder 21 disposed in the chamber 20 while the other opening is closed with an end plate 54.

A direct current voltage is applied to the magnetic coil 52 from the power source 53, whereby a magnetic field can be generated substantially along the internal wall of the transport pipe 51 within the transport pipe 51. Indicated at 55 in FIG. 2 are lines of magnetic force in the magnetic field formed in this way.

The vacuum arc evaporation source 4 has a cathode 41, a cathode holder 42, and an arc power source 43. The cathode 41 is composed of carbon and is fixed to the end plate 54 at an end of the transport pipe 51 via the holder 42 formed of an insulating material. The holder 21 (substrate 11 held by the holder 21) in the chamber 20 can not be seen from the position of the cathode 41 disposed at the end of the transport pipe 51 because of interruption by the internal wall of the transport pipe 51 curved at an angle of 90 degrees. In other words, The internal wall of the transport pipe 51 exists on a straight line connecting the cathode 41 with the holder 21.

In this example, the end plate 54 serves also as an anode. Arc discharge is caused between the end plate (anode) 54 and the cathode 41 when an arc discharge voltage is applied between them from the arc power source 43. The evaporation source 4 has a trigger electrode 44 for ignition of arc discharge as in the above-mentioned evaporation source 3.

The trigger electrode 44 is connected to the end plate 54 via a resistor 45. The trigger electrode 44 can be moved in right and left directions in the figure by a driving device (not shown) from a position wherein its tip is in contact with the cathode 41 to a position wherein its tip is out of contact therewith.

When the trigger electrode 44 is brought into and out of contact with the cathode 41 while applying a negative voltage from the arc power source 43 to the cathode 41, electric sparks are emitted between the trigger electrode 44 and the cathode 41. Arc discharge is triggered by the sparks. Carbon as a cathode material is heated by the arc discharge, melted and evaporated.

Plasma is generated in front of the cathode 41 (rightward of the cathode 41 in the figure) by the arc discharge, whereby the evaporated carbon is partly ionized. In other words, in the vacuum arc evaporation source 4, plasma containing carbon ions can be produced in front of the cathode 41 (rightward of the cathode 41 in the figure) by the arc discharge.

In the vacuum arc deposition apparatus AP1 as described above, the mixed layer 12, tungsten film 13 and DLC film (carbon film) 14 can be formed in the following way on the substrate 11 as held by the holder 21. In formation of the mixed layer and the films, the holder 21 holding the substrate 11 may be rotated by a driving device (not shown) to form a uniform mixed layer and uniform films.

In deposition of a film, gas(es), e.g., air including reactive gases such as nitrogen gas and oxygen gas) is removed from the chamber 20 by the evacuator 23 to bring the inside to a state of reduced pressure of, e.g., $10^{-4}$ Torr (approximately $10^{-2}$ Pa) or less. Thereafter an inactive gas such as argon gas is introduced into the chamber 20 by the gas supply unit 24 to bring the inside to a state of, e.g., $1\times10^{-3}$ Torr (approximately $1\times10^{-1}$ Pa) to $8\times10^{-3}$ Torr (approximately $8\times10^{-1}$ Pa) so that the retention of arc discharge is facilitated in the evaporation sources 3 and 4.

When the mixed layer 12 is formed, the operation employs the evaporation source 3 having the cathode 31 composed of tungsten, not the evaporation source 4. By the evaporation source 3, plasma containing tungsten ions can be produced in front of the cathode 31 as described above, i.e., between the cathode and the holder 21 holding the substrate 11. In this operation, a relatively high negative direct current voltage (e.g., approximately DC-400V to DC-2000V) is applied from the bias power source 22 to the substrate 11 via the holder 21.

The tungsten ions are attracted to the substrate 11 by the bias voltage applied to the substrate 11 and are made to collide with the substrate 11, whereby the ions are thrust into the substrate 11. That is, the substrate 11 is subjected to a bombarding process by the tungsten ions, whereby a layer containing the thrust tungsten is formed as a surface layer on the substrate 11, i.e., the mixed layer 12 containing substrate-constituting elements and tungsten is formed.

Thereafter the tungsten film 13 is formed on the mixed layer 12 while maintaining the pressure in the chamber 20. When the tungsten film 13 is formed, the operation employs the evaporation source 3 having the cathode 31 composed of tungsten, not the evaporation source 4. When the tungsten film 13 is formed, plasma containing tungsten ions is produced by the evaporation source 3 and a negative voltage is applied from the bias power source 22 to the substrate 11.

When the tungsten film 13 is formed, a negative direct current voltage (e.g., approximately DC-200V) which is lower in absolute value than when the mixed layer 12 is formed (when the bombarding process is carried out) is applied to the substrate 11. Thereby the tungsten ions are attracted to the substrate 11 and are made to collide with the substrate 11, so that the tungsten film 13 is formed on the mixed layer 12.

Since the bias voltage to be applied to the substrate 11 is so low that an action of thrusting (bombarding) the tungsten ions into the substrate 11 is small and tungsten becomes accumulated on the mixed layer 12, forming the tungsten film 13 on the mixed layer 12.

Subsequently, the DLC film (carbon film) 14 is formed on the tungsten film 13 while retaining the pressure in the chamber 20. When the DLC film 14 is formed, the operation employs the evaporation source 4 having the cathode 41 composed of carbon, not the evaporation source 3. By the evaporation source 4, plasma containing carbon ions is produced in front of the cathode 41 as described above. The plasma is transported along the transport pipe 51 by the magnetic field generated by the magnetic coil 52, and is led toward the substrate 11 supported by the holder 21 in the chamber 20.

In this operation, a negative bias voltage has been applied from the bias power source 22 to the substrate 11. In this example, a pulse-type negative bias voltage is applied to the substrate 11. For example, a pulse voltage of about −1 kV to about −10 kV is applied to the substrate 11 at a frequency of 5 kHz and at a duty ratio of about 2% to about 10%. The carbon ions in the plasma are attracted to the substrate 11 by the bias voltage applied to the substrate 11, whereby the DLC film (carbon film) 14 is formed on the tungsten film 13.

The macro-particles (droplets) of the cathode-constituting substance produced in the generation of plasma containing carbon ions in the evaporation source 4 are removed as follows to prevent the macro-particles from reaching the chamber 20 by the magnetic filter 5. The macro-particles having no electric charge make a substantially straight advance in a direction initially taken, starting from the cathode 41 because the macro-particles do not curve due to the magnetic field generated with the magnetic coil 52.

Most of the macro-particles are made to collide with the internal wall of the curved transport pipe 51, consequently failing to reach the inside of the chamber 20. Even if the macro-particles start to move in a direction in which the inside of the chamber 20 is reached, the substrate 11 would not exist on a straight line in the starting direction, making it impossible for the macro-particles to adhere to the substrate 11.

When a mixed layer 12, tungsten film 13 and DLC film 14 are formed by the above-mentioned method, the following advantages are gained.

The mixed layer 12, tungsten film 13 and DLC film 14 can be formed at a relatively higher deposition rate by using the cathode material evaporated by the arc discharge than when formed by a plasma CVD method, sputtering method or laser deposition method, resulting in higher productivity. The mixed layer 12, tungsten film 13 and DLC film 14 can be formed on the substrate 11, even if the substrate is in a relatively complicated shape (e.g., a substrate in a cubic shape), according to the vacuum arc deposition apparatus AP1. In addition, deposition is feasible with relative easiness even over a large area.

The mixed layer 12 is formed by subjecting the substrate to a bombarding process so that adhesion of the mixed layer 12 to the substrate 11 is increased. Since the substrate 11 is subjected to a bombarding process, the substrate 11 can be cleaned by sputtering and can be heated, whereby adhesion of the tungsten layer 13 (to be formed later) to the mixed layer 12 is increased.

When the DLC film (carbon film) 14 is formed by the vacuum arc deposition method as described above, the DLC film 14 has a higher hardness and a less content of hydrogen than when formed by a plasma CVD method, sputtering method and laser deposition method. Because of less content of hydrogen, the DLC film 14 can stably exhibit a low friction characteristic even under a high temperature environment.

Since the DLC film 14 is formed while applying the pulse-type bias voltage to the substrate 11, the internal stress in the DLC film 14 can be lowered and the DLC film 14 can have a highly smooth surface.

All of the mixed layer 12, tungsten film 13 and DLC film 14 are formed using the same vacuum arc deposition apparatus AP1. Therefore, the transport of the substrate 11, evacuation, etc. can be performed in a shorter time than when one or two of them are formed by other apparatus. This means that the mixed layer, tungsten film and carbon film can be so efficiently formed, resulting in increased productivity.

The vacuum arc deposition apparatus AP1 has the evaporation source 3 for use in forming the mixed layer 12 and the tungsten film 13 and the evaporation source 4 for use in forming the DLC film 14, namely two evaporation sources so that the mixed layer 12, the tungsten film 13 and the DLC film 14 can be continuously formed without exchange of the cathode in each of the evaporation sources. Thereby the mixed layer 12, tungsten film 13 and DLC film 14 can be so efficiently formed with high productivity.

Since the magnetic filter 5 is provided for the evaporation source 4 for use in forming the DLC film 14, the macro-particles of the substance constituting the cathode 41 can be prevented from adhering to the substrate 11 (tungsten film 13), whereby the DLC film 14 can be suppressed from lowering the surface-smoothness of the DLC film 14. The DLC film 14 can be further suppressed from peeling and cracking, starting from a part of the DLC film 14 to which macro-particles have adhered. In this example, the magnetic filter 5 is provided only for the evaporation source 4 having the carbon cathode in which macro-particles are likely to develop but may be also provided for the evaporation source 3.

(4) Experiments on Material and Thickness of Underlying Layer of Carbon Film

Test pieces of the carbon film-coated article were produced to investigate the adhesion of the carbon film to the substrate using tungsten films of varied thicknesses serving as an underlying layer of the carbon film.

The test pieces of the carbon film-coated article were produced as follows. A mixed layer, tungsten film and carbon film (DLC film) were formed by the above-mentioned method using the vacuum arc deposition apparatus of the type shown in FIG. 2. The substrate was one made of chromium-molybdenum steel SCM415. Each of the layer and films was formed in the chamber under a gas pressure condition prepared by introducing 100 sccm of argon gas into the chamber to attain a pressure of $5 \times 10^{-3}$ Torr (approximately $5 \times 10^{-1}$ Pa) after the air was evacuated from the chamber 20 to attain a pressure of $1 \times 10^{-5}$ Torr (approximately $1 \times 10^{-3}$ Pa).

A mixed layer was formed by supplying the tungsten cathode in the evaporation source with an arc current at 100 A (100 amperes) and applying a bias voltage of DC (−1000V) to the substrate to subject the substrate to a bombarding process. A tungsten film was formed by supplying the tungsten cathode in the evaporation source with an arc current at 80 A (80 amperes) and applying a bias voltage of DC(−200V) to the substrate according to the vacuum arc deposition method. A DLC film was formed by supplying the carbon cathode in the evaporation source with an arc current at 80 A and applying a pulse-type bias voltage of −5 kV to the substrate according to the vacuum arc deposition method. The pulse voltage was applied to the substrate at a frequency of 10 kHz, and a duty ratio of 5%.

Five test pieces of the carbon film-coated article were produced. The test pieces were different from each other in that the tungsten films were 5 nm, 10 nm, 50 nm, 100 nm and 200 nm, respectively in thickness. In any of these test pieces, the mixed layer had a thickness of 10 nm and the DLC film had a thickness of 500 nm. The thickness of the mixed layer was 10 nm at which good results were achieved in the experiments to be described later.

The following three types of comparative test pieces of the carbon film-coated article were produced to investigate the adhesion of the carbon film (DLC film) to the substrate. All of these comparative test pieces had substrates of the same material (SCM415 steel) as the substrate for the test pieces having the tungsten film.

In the first type comparative test pieces, a molybdenum (Mo) film was used instead of the tungsten film as the underlying layer of the DLC film, and a mixed layer was one corresponding to the underlying layer (molybdenum film). That is, the first type comparative test pieces had a molybdenum (Mo) film and a mixed layer containing molybdenum and substrate-constituting element(s) between the DLC film and the substrate.

The first type comparative test pieces were produced in the same manner as done in producing the test pieces having the tungsten film except that molybdenum was used as a cathode material in the evaporation source which was used in forming the molybdenum film and the mixed layer.

More specifically, the mixed layer in each of the first type comparative test pieces was formed by subjecting the substrate to a bombarding process under the same deposition conditions as in forming the mixed layer in the test pieces having the tungsten film. The molybdenum film in each of the first type comparative test pieces was formed by a vacuum arc deposition method under the same deposition conditions as in forming the tungsten film in the test pieces having the tungsten film. The DLC film in each of the first type comparative test pieces was formed by a vacuum arc deposition method under the same deposition conditions as in forming the DLC film in the test pieces having the tungsten film.

Four first type comparative test pieces were formed such a manner that molybdenum films were 5 nm, 10 nm, 50 nm and 100 nm, respectively in thickness. In each of the first type comparative test pieces, the mixed layer had a thickness of 10 nm, and the DLC film had a thickness of 500 nm.

In the second type comparative test pieces, a chromium (Cr) film was used instead of the tungsten film as the underlying layer of the DLC film, and a mixed layer was one corresponding to the underlying layer (chromium film). That is, the second type comparative test pieces had a chromium film and a mixed layer containing chromium and substrate-constituting element(s) between the DLC film and the substrate.

The second type comparative test pieces were produced in the same manner as done in producing the test pieces having the tungsten film except that chromium was used as a cathode material in the evaporation source which was used in forming the chromium film and the mixed layer. More specifically, the mixed layer in each of the second type comparative test pieces was formed by subjecting the substrate to a bombarding process under the same deposition conditions as in forming the mixed layer in the test pieces having the tungsten film.

The chromium film in each of the second type comparative test pieces was formed by a vacuum arc deposition method under the same deposition conditions as in forming the tungsten film in the test pieces having the tungsten film. The DLC film in each of the second type comparative test pieces was formed by a vacuum arc deposition method under the same deposition conditions as in forming the DLC film in the test pieces having the tungsten film.

Five second type comparative test pieces were produced in such manner that chromium films were 5 nm, 10 nm, 50 nm, 100 nm and 200 nm, respectively in thickness. In each of the second type comparative test pieces, the mixed layer had a thickness of 10 nm, and the DLC film had a thickness of 500 nm.

In the third type comparative test piece, a DLC film was formed directly on the substrate. The DLC film in the third type comparative test piece was formed by a vacuum arc deposition method under the same deposition conditions as in forming the DLC film in the test pieces having the tungsten film. The DLC film in the third type comparative test piece had a thickness of 500 nm.

The adhesion of the DLC film to the substrate in each of the test pieces was evaluated by a Rockwell hardness testing machine as follows. The DLC film over the substrate was depressed under a load of 150 kg by an indenter (conical diamond indenter) to be used in a C-scale Rockwell hardness test, whereby the adhesion of the DLC film to the substrate was evaluated in terms of an area of peeled DLC film around the impression formed by the depression. The results show that the smaller the peeled film area is, the higher the adhesion of the DLC film to the substrate is.

Figure 3:
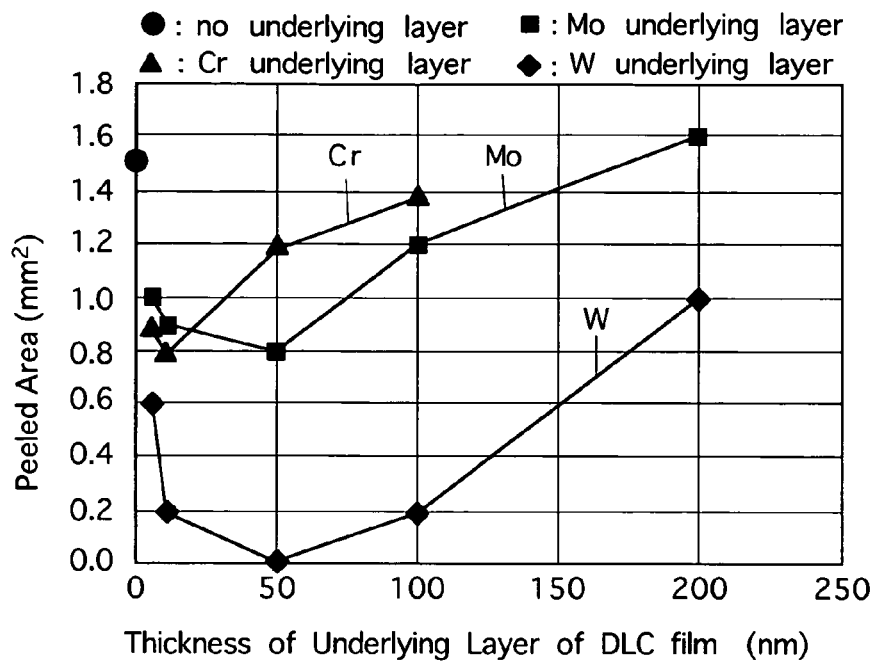
FIG. 3 is a graph showing a relation between a material and thickness of an underlying layer of (under) the DLC film on one hand and a peeled area representing adhesion of the DLC film to the substrate on the other hand.

The results are shown in FIG. 3. It is apparent from FIG. 3 that when a tungsten film and a mixed layer containing tungsten are formed between the DLC film and the substrate, the adhesion of the DLC film to the substrate is higher than when the DLC film is formed directly on the substrate. It is also evident that when the underlying layer of the DLC film has the same thickness, a tungsten film formed as the underlying layer achieves a higher adhesion of the DLC film to the substrate than when a molybdenum film or a chromium film is used as the underlying layer.

It is further seen that a tungsten film, when too thick or too thin, lowers the adhesion of the DLC film to the substrate. The thickness of the tungsten film is preferably about 5 nm or greater, more preferably about 10 nm or greater. The thickness of the tungsten film is preferably about 170 nm or less, more preferably about 150 nm or less, most preferably about 100 nm or less.

(5) Experiments on the Thickness of Mixed Layer

Test pieces of the carbon film-coated article were produced to investigate the adhesion of the carbon film (DLC film) to the substrate using mixed layers of varied thicknesses.

Six test pieces of the carbon film-coated article were produced. These test pieces are different from each other in that the mixed layers formed of tungsten and element(s) constituting the substrate had thicknesses of 2 nm, 5 nm, 10 nm, 50 nm, 100 nm and 200 nm, respectively. The mixed layer, tungsten film and DLC film in these test pieces were formed by the same method and under the same conditions as described above. The substrate in any test piece was made of chromium-molybdenum steel SCM 415. In any of test pieces, the tungsten film had a thickness of 50 nm and the DLC film had a thickness of 500 nm. When the tungsten film has a 50 nm thickness, the DLC film exhibits an excellent adhesion to the substrate as apparent from FIG. 3.

For a comparative purpose, a test piece having no mixed layer, namely having a tungsten film and a DLC film formed in this order on the substrate was produced to investigate the adhesion of the DLC film to the substrate. The tungsten film and DLC film in this comparative test piece were formed by the same method and under the same conditions as described above. The tungsten film had a thickness of 50 nm and the DLC film had a Thickness of 500 nm in the comparative test pieces.

The adhesion of the DLC film to the substrate in each of the test pieces was evaluated in terms of an area of peeled DLC film around the impression formed with an indenter (conical diamond indenter) in the same manner as described above. In the comparative test piece without a mixed layer, the DLC film became peeled, whereas none of DLC layers in the test pieces having the mixed layer became peeled irrespectively of the thickness of the mixed layer.

As described above, a difference in the adhesion of the DLC film to the substrate due to the thickness of mixed layer was not found when measured by the foregoing evaluation method. The adhesion of DLC films in these test pieces were further evaluated as described below in order to investigate a preferred range of thickness of the mixed layer.

A pressing piece was brought into contact with the DLC film on the substrate under a pressing force in an engine oil and was rotated at a revolution speed of 1042 rpm (sliding speed 1200 mm/sec) by a motor. In this operation, while gradually increasing a load of the pressing piece against the DLC film (a load on the pressing piece in pressing the pressing piece against the DLC film), there was found out a load[$kgf/mm^2$] involved when a rotating torque of the motor required to rotate the pressing piece at the foregoing revolution speed reached 20 [N] or more. When the DLC film became peeled by increasing the load, a great rotating torque of the motor was needed in rotating the pressing piece. That is, even when a heavy load was imposed, the rotating torque of the motor was small in rotating the pressing piece if a highly slidable DLC film firmly adhered to the substrate and did not separate from the substrate. Consequently this shows that the heavier the load measured is, the higher the adhesion of the DLC film to the substrate is. The pressing piece used was in the shape as prescribed under JIS-K7218A, namely cylindrical and was made of carbon steel for machine structural use (S50C).

Figure 4:
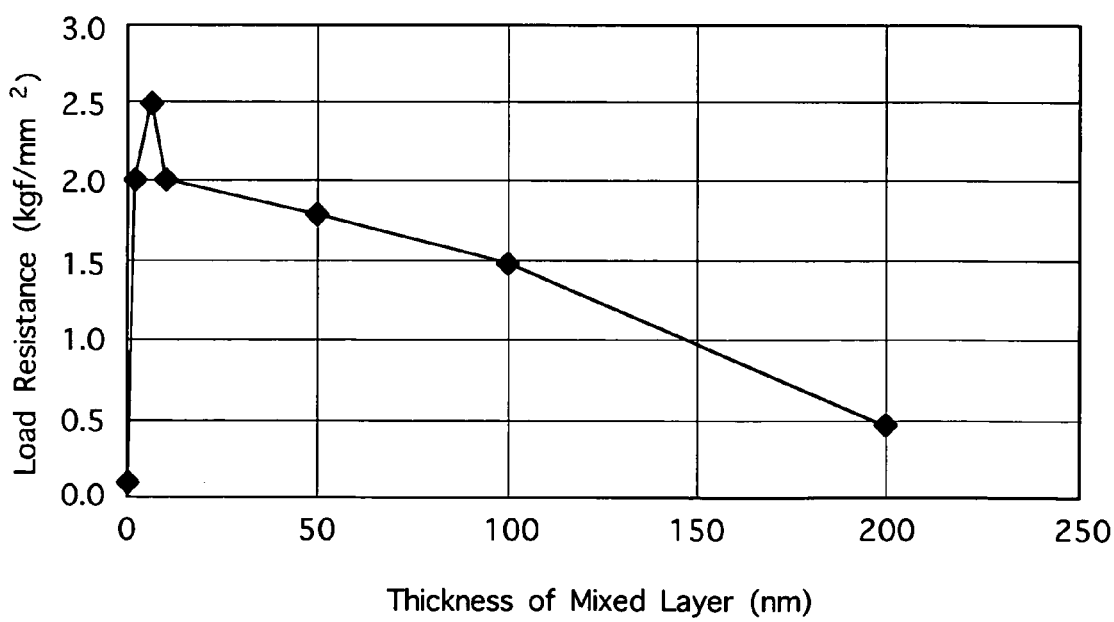
FIG. 4 is a graph showing a relation between thickness of the mixed layer formed between the DLC film and the substrate and a load resistance representing adhesion of the DLC film to the substrate.

The results are shown in FIG. 4. FIG. 4 shows that when the mixed layer containing tungsten and a substrate-constituting element(s) is too thick or too thin, the adhesion of the DLC film to the substrate is lowered. It is also apparent from FIG. 4 that the thickness of the mixed layer is preferably about 1 nm or more, more preferably about 2 nm or more. It is further evident that the thickness of the mixed layer is preferably about 200 nm or less, more preferably about 100 nm or less, especially more preferably about 50 nm or less, most preferably about 10 nm or less.

As set out above, the invention provides a carbon film-coated article in which a carbon film is formed and the adhesion of the carbon film to the substrate is high, and a method of producing the same. According to the producing method of the invention, the carbon film and others can be efficiently formed.

Although the present invention has been described and illustrated in detail, it is clearly understood that the same is by way of illustration and example only and is not to be taken by way of limitation, the spirit and scope of the present invention being limited only by the terms of the appended claims.

What is claimed:

1. A carbon film-coated article comprising a substrate; a mixed layer formed on at least a part of the substrate, composed of an element(s) constituting the substrate and tungsten, and having a thickness in a range from 2 nm to 200 nm; a tungsten film formed on the mixed layer; and a carbon film formed on the tungsten film.

2. The carbon film-coated article according to claim 1, wherein said mixed layer has a thickness in a range from 5 nm to 100 nm.

3. The carbon film-coated article according to claim 1, wherein said tungsten film has a thickness in a range from 5 nm to 170 nm.

4. The carbon film-coated article according to claim 3, wherein said carbon film has a thickness in a range from 500 nm to 10 μm.

5. The carbon film-coated article according to claim 1, wherein said substrate is made of a material comprising iron as a main component.

6. The carbon film-coated article according to claim 1, wherein said tungsten film has a thickness in a range from 10 nm to 100 nm.

7. The carbon film-coated article according to claim 1, wherein said carbon film has a thickness in a range from 500 nm to 10 μm.

* * * * *